United States Patent
Gilmore et al.

(10) Patent No.: US 6,716,321 B2
(45) Date of Patent: Apr. 6, 2004

(54) MODIFIED ELECTRICAL PROPERTIES OF SPUTTERED THERMAL COATINGS

(75) Inventors: William D. Gilmore, Lakewood, CA (US); Richard M. Kurland, Marina del Rey, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 63 days.

(21) Appl. No.: 09/971,751

(22) Filed: Oct. 4, 2001

(65) Prior Publication Data
US 2003/0066748 A1 Apr. 10, 2003

(51) Int. Cl.[7] ............... C23C 14/34; B05D 1/00
(52) U.S. Cl. ............... 204/192.1; 427/445
(58) Field of Search ............ 204/192.1, 298.12, 204/298.16, 298.02, 298.06; 427/445

(56) References Cited

U.S. PATENT DOCUMENTS 4,915,810 A  *  4/1990  Kestigian et al. ...... 204/298.04
5,466,355 A  *  11/1995  Ohhashi et al. ........ 204/298.13

* cited by examiner

Primary Examiner—Steven H. VerSteeg
(74) Attorney, Agent, or Firm—McAndrews, Held & Malloy, Ltd.

(57) ABSTRACT

A system and method for sputter depositing a protective coating on a surface. The system includes a coating device, a first material for coating, a second material for coating and a surface to be coated. Preferably, the first material and the second material are sputter deposited on the surface in a predetermined proportion to yield a coating having tailored thermophysical and surface resistance properties. The proportion may be controlled by controlling exposed surface area of the first material and exposed surface area of the second material, as well as a magnetic field applied to the first and second materials.

8 Claims, 3 Drawing Sheets

MODIFIED ELECTRICAL PROPERTIES OF SPUTTERED THERMAL COATINGS

BACKGROUND OF THE INVENTION

Spacecraft, satellites, and other space systems typically employ many sensitive and expensive components for performing various space functions, such as information gathering and transmission and optical imaging. When in space, a spacecraft is exposed to vast temperature extremes of heat and cold. Thermal radiation from the sun may heat a spacecraft and the spacecraft's components to very high temperature levels which may damage the spacecraft. Visible light is the main source of thermal energy in the space environment. Therefore, it has heretofore been known in the art to provide passive thermal control in the form of second surface mirrors, special paints, multi-layered thermal blankets, or sunshields over sensitive spacecraft components to impede, reflect, and/or emit harmful solar radiation to prevent spacecraft components from being excessively heated.

Thermal control of a spacecraft is typically provided by radiating heat from external spacecraft surfaces. The solar heating and cooling of the spacecraft is determined by the quantity of energy absorbed and the quantity of energy emitted by the spacecraft. The bulk of the energy absorbed by the spacecraft when the spacecraft is in space is from the peak of the solar radiation spectrum at wavelengths between 400 to 800 nm. The bulk of the energy emitted is from the infrared spectrum at wavelengths greater than 1000 nm. The applicable equation of solar heating is provided by:

$$\alpha A_1 E_0 = \epsilon A_2 S T^4, \text{ or} \quad (1)$$

$$T = [(\alpha/\epsilon)(A_1/A_2)(E_0/S)]^{1/4} \quad (2)$$

where $\alpha$ is the solar absorptance of the spacecraft surface, $A_1$ is the solar absorbing area, $E_0$ is the solar irradiance, $\epsilon$ is the emittance of the spacecraft surface, $A_2$ is the emittance area, S is the Stefan-Boltzman constant, and T is temperature (absolute).

Additionally, spacecraft surfaces are exposed to space plasma environments that may create a surface electrostatic charge build-up. The charge build-up, if not controlled, may reach levels where discharges will occur that may damage spacecraft components or structure or may create deleterious electromagnetic interference of electronic components and circuitry, rendering a satellite system inoperative. Thus, satellites also benefit from surfaces that have acceptable electrostatic discharge control properties so that the surfaces may be reasonably grounded to prevent surface charge build-up.

Thermophysical properties of a material are measured in terms of the ratio of solar absorptance to hemispherical emittance ($\alpha/\epsilon$). Solar absorptance is a measure of the percentage of solar energy that is absorbed by the material. Hemispherical emittance is a measure of the emittance of heat from a surface in all directions. Emittance is the heat exchange of a surface with the surface's surrounding environment. Typically, emittance is given as a ratio of the heat exchange of a real surface to the heat exchange of a perfect absorber at a given temperature. Thus, the ratio of solar absorptance to hemispherical emittance that defines the thermophysical properties of a coating or material is a ratio of how much heat is absorbed by the material to how much heat is emitted by the material. Consequently, as indicated by Equation (2), a low ratio ($\alpha/\epsilon<0.5$) is preferred to obtain lower temperatures to protect underlying components from damage from solar heating.

Additionally, other current coatings may provide electrostatic discharge protection for a surface. Electrostatic discharge protection may be measured in terms of surface resistivity, also known as surface resistance. Surface resistivity ($\rho$) is the resistance of a material to the flow of electrical current over the surface of a material. Consequently, a low resistivity ($10^6$ to $10^8$ Ohms/square) is preferred in order to prevent electrostatic charge from collecting or "building up" on a surface.

As may be apparent to those of skill in the art, a surface coating that exhibits both good thermal protection and good electrostatic discharge protection is highly desirable for use in space applications. Currently, protective coatings for space system surfaces and/or electrical circuit surfaces may be produced to provide good thermal protection for the surface, or coatings may be produced to provide good electrostatic discharge protection for the surface. That is, current coatings do not possess an acceptable balance of thermophysical and surface resistance properties, or they may not be applied to flexible membrane surfaces because of their brittle nature. Current techniques of overcoating materials for thermal protection also upset the desired balance of thermal control and surface resistance. Thus, there is a need for a protective coating that both protects a surface from over-heating and protects a surface from electrostatic charge build-up and that may easily be applied to both flexible and rigid surfaces. Additionally, there is a need for a production system for depositing such a coating on a surface.

Current coating systems, such as paints, are thick (t~5 mils or $1.25 \times 10^6$ Angstroms) and may not be used on flexible membranes or require conductive pigments to obtain an acceptable combination of thermophysical ($\alpha/\epsilon<0.5$) and surface resistance ($\rho$ of $10^6$ to $10^8$ Ohms/square) properties. Overcoatings of transparent conductive oxides are also used to obtain lower surface resistance properties. But such oxide overcoatings affect the thermophysical properties and are brittle and thus not conducive for flexible membrane applications. Single semiconductor materials such as silicon or germanium may provide acceptable thermophysical coatings but have unacceptably high surface resistance ($\rho>10^{14}$ Ohms/square). Conductor materials such as platinum, silver, gold, copper, or stainless steel have acceptably low surface resistance properties, but have unacceptably high thermophysical properties ($\alpha/\epsilon>1$). Therefore, it is highly desirable to have a thin coating with low thermophysical properties for heat control and low surface resistance for electrostatic discharge control. It is especially desirable for such a coating to be flexible and adhere to surfaces.

Currently, the preferred method for producing and applying a very thin (t<2000 Angstroms) coating on membrane or rigid structural surfaces is through sputtering deposition. Sputter deposition, or sputtering, refers to the process of bombarding a solid (referred to as the target) with high energy ions from a plasma which causes atoms or molecules to be ejected from the target and re-deposited on the surface of the substrate located near the target. Thus, the atoms from the target form a controlled, uniformly thin film on the substrate.

Current attempts to create a sputtering target with a balance of thermophysical and surface resistance properties have involved processes of physically mixing or combining materials into alloys to form a sputtering target. These processes are time consuming because the different components must be integrated into a single alloy. These processes are also expensive due to the complexity of the alloy process. Additionally, it is difficult to arrive at the precise balance of materials that will produce the desired thermophysical properties and surface resistance, and the target alloy material may not be altered once it is cast. Furthermore, alloys produced may generate unwanted heat during sputter deposition and may react unfavorably to the conditions of sputter deposition. Thus, there is a need for a cost-effective method of easily creating a sputtering target that will produce the desired thermophysical and surface resistance properties in a protective coating.

BRIEF SUMMARY OF THE INVENTION

The preferred embodiments of the present invention relate to a system and method for depositing a protective coating on a surface. That is, the preferred embodiments of the present invention relate to a system and method for depositing a very thin coating with desired thermophysical and surface resistance properties on a surface. The system includes a coating device including a first material for coating, a second material for coating and a surface to be coated. Preferably, the coating device is a sputter deposition device. Preferably, one of the first and second materials is a semiconductor material, such as silicon or germanium, for example, and the other is a conducting material, such as stainless steel, silver, aluminum, gold, and/or platinum, for example. The first material and second material have differing thermophysical properties and surface resistance properties. In a preferred embodiment, the first material and the second material are deposited on the surface in a predetermined proportion to yield an intermixed coating having desired thermophysical and surface resistance properties. The proportion may be controlled by controlling exposed surface area of the first material and exposed surface area of the second material, as well as a magnetic field applied to the first and second materials.

The method includes simultaneously depositing at least a portion of the first material and at least a portion of the second material on a surface to form a thin intermixed coating. In a preferred embodiment, the first material is a semiconductor or insulating material and the second material is a conducting material. Preferably, the materials are deposited on the surface in a predetermined proportion to yield a coating having desired thermophysical properties and surface resistivity.

DETAILED DESCRIPTION OF THE INVENTION

The preferred embodiments of the present invention relate to a novel combination of deposition materials that may coat a surface to modify both thermophysical properties and electrical resistance of the surface. The preferred embodiments of the present invention also relate to a system and method for deposition of a coating with a desired combination of thermophysical and electrical resistance properties.

Figure 1:
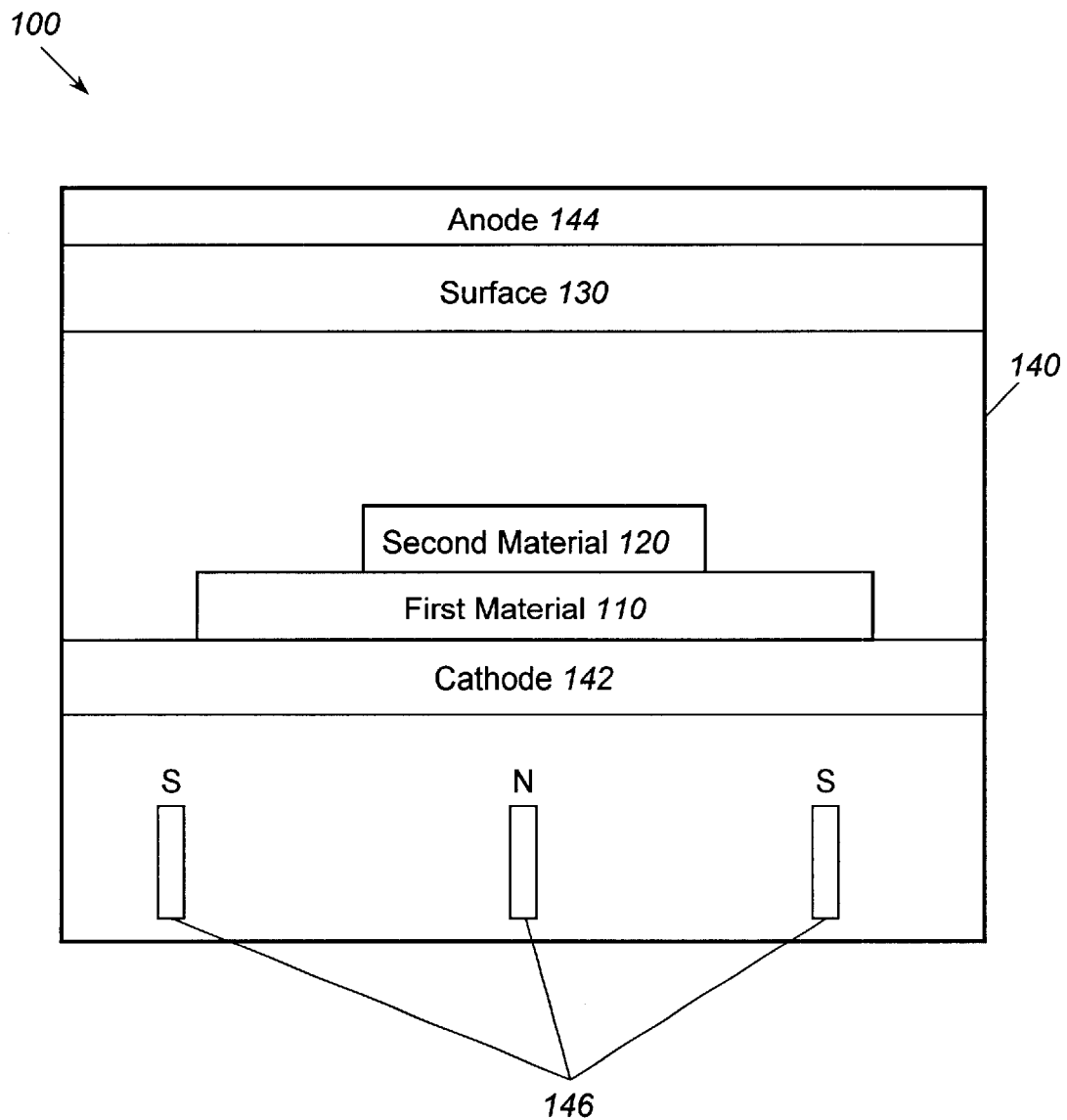
FIG. 1 illustrates a system for coating surfaces with a protective coating having predetermined thermophysical and electrical resistance properties in accordance with a preferred embodiment of the present invention.

FIG. 1 illustrates a system 100 for coating surfaces with a protective coating having predetermined thermophysical and electrical resistance properties. The system 100 includes a first material 110 for sputter deposition, a second material 120 for sputter deposition, a surface 130 to be sputter coated, and a sputtering device 140. The first material 110 and the second material 120 form a sputtering target. The sputtering device 140 houses the sputtering target and the surface 130 to facilitate the sputter coating of the surface 130 by material from the sputtering target, as described below.

The first material 110 is preferably a semiconductor material, such as silicon or germanium, for example. The first material 110 may also be an insulating material. The second material 120 is preferably a conducting material, such as stainless steel, silver, aluminum, gold, platinum, or other metal, for example. In an alternative embodiment, the first material 110 may be a conducting material, and the second material 120 may be a semiconductor or insulating material. In a preferred embodiment, the second material 120 is positioned on top of the first material 110. That is, a sputtering target is formed by positioning the second material 120 on top of the first material 110. Preferably, a small quantity of the conducting material is positioned on a large quantity of the semiconductor or insulating material because only a small quantity of conducting material is required to achieve the desired electrical resistance properties. In a preferred embodiment, the desired thermophysical properties and electrical resistance may be determined by adjusting the relative surface areas of the first material 110 and the second material 120, as described below.

In a preferred embodiment, the second material 120 is magnetically positioned on the first material 110. Alternatively, the second material 120 may be bonded to the first material 110. In an alternative embodiment, the second material 120 may be clamped, secured, or otherwise affixed to the first material 110 to form the sputtering target. In an alternative embodiment, the second material 120 may rest alongside the first material 110.

Figure 2:
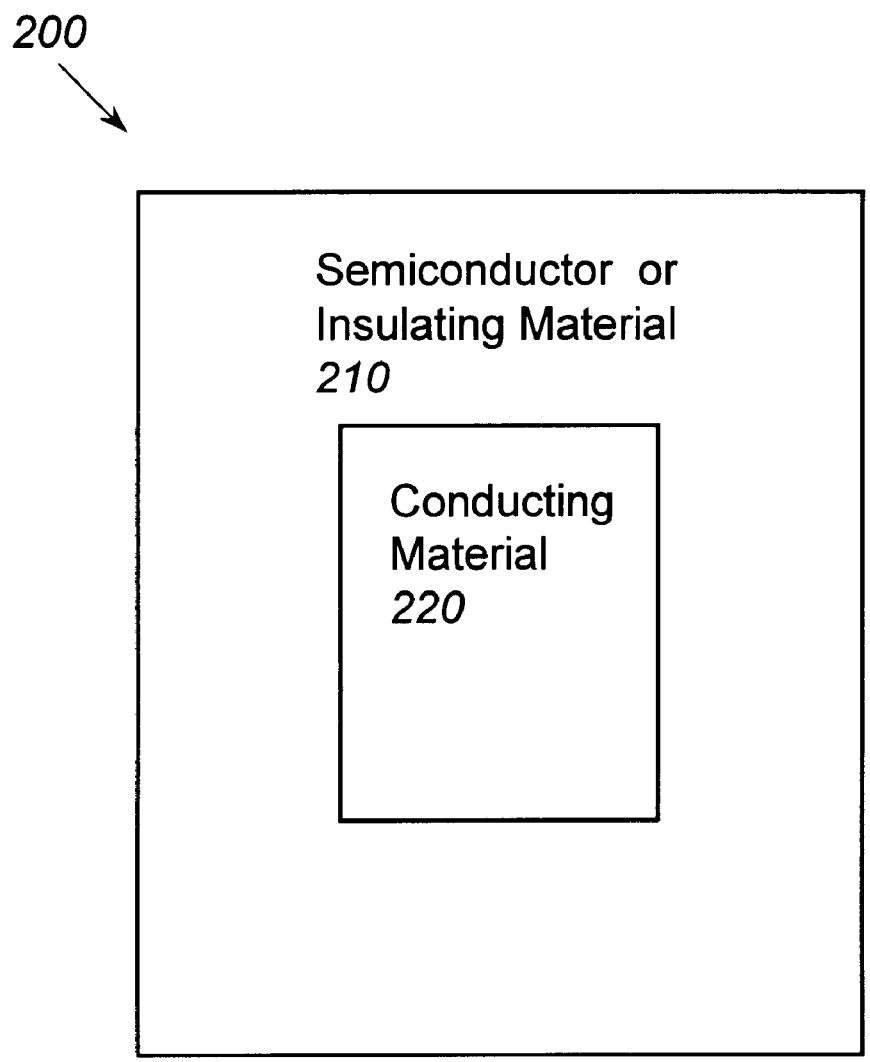
FIG. 2 depicts a sputtering target in accordance with a preferred embodiment of the present invention.

A top view of a preferred embodiment of a sputtering target 200 is depicted in FIG. 2. The sputtering target 200 includes an insulating or semiconductor material 210 and a conducting material 220. For example, a magnetized conducting material, such as magnetic stainless steel, for example, is magnetically affixed to a semiconductor or insulating material to form a sputtering target. The sputtering target 200 may be used in sputter deposition to coat a surface 130, as described below.

In a preferred embodiment, the surface 130 is a polymer film, such as KAPTON®, MYLAR®, LEXAN®, or other such membrane material, for example. The surface 130 may be installed in a space system, such as a satellite, space shuttle, or other space system, for example, for use as an exterior surface in multilayered insulation blankets, sunshields, radiator panels, solar sails, occulters, or large gossamer space structures, for example. The surface 130 may also be installed as a protective surface for a semiconductor device or other electrical circuit, for example. The surface 130 may also be any structural element, such as panels, booms, or curved dishes, or other thermal controlled structure, for example, that is exposed to a space plasma environment.

The present system may be implemented with any type of deposition system. However, in a preferred embodiment, the sputtering device 140 is a magnetron sputtering device, such as a planar magnetron sputtering device, for example. Alternatively, the sputtering device 140 may also be a gun type magnetron sputtering device, a cylindrical post magnetron sputtering device, or other sputtering device, for example. The sputtering device 140 includes a cathode 142 on which the sputtering target is positioned. Preferably, the sputtering device 140 also includes a magnet assembly 146 used to generate a magnetic field around the sputtering target. The magnet assembly 146 may include bar magnets, annular magnets, coil magnets, or other magnets, for example. The magnet assembly 146 may be a fixed magnet or an electromagnet, for example. The sputtering device 140 also includes an anode 144 on which the surface 130 to be coated is positioned. In addition, the sputtering device 140 may include a cooling system, such as a water cooling system, for example, to keep the sputtering device 140 cool.

In operation, the first material 110 is placed inside the sputtering device 140, such as a magnetron sputtering device, for example. For purposes of illustration only, a magnetron sputtering device will be used in the following operational example. In the magnetron sputtering device, the first material 110 is positioned on top of the cathode 142 of the magnetron sputtering device. Then, the second material 120 is positioned on top of the first material 110 in the magnetron sputtering device. Preferably, the second material 120 is magnetic and is held in place on the first material 110 by the magnet assembly 146 in the magnetron sputtering device. Alternatively, the second material 120 may be otherwise positioned on the first material 110. The first material 110 and the second material 120 form the sputtering target. The surface 130 to be coated is preferably positioned opposite the sputtering target on the anode 144 in the magnetron sputtering device.

When the first material 110, the second material 120, and the surface 130 have been positioned in the magnetron sputtering device, the interior cavity of the magnetron sputtering device is evacuated to a low pressure and then filled with an inert gas, such as argon, for example. Then, an electric field is generated in the magnetron sputtering device. Preferably, the electric field is generated by radio frequency (RF) excitation, for example, at 10–100 MHz. The electric field excites the gas to a high energy state to create a plasma. Gas ions from the plasma are attracted to the cathode 142 of the mangetron sputtering device. The attracted gas ions thus strike the first material 110 and the second material 120 of the sputtering target at the cathode 142. A magnetic field is created by the magnet assembly 146 in the cathode 142 of the magnetron sputtering device to confine the plasma to an area around the sputtering target. By confining the plasma, collisions between the gas ions and the sputtering target are improved.

When gas ions strike the first material 110 and the second material 120, the ions transfer their energy to particles of the first material 110 and the second material 120. As a result, particles of the first material 110 and the second material 120 break free or "sputter" from the sputtering target and are propelled onto the surface 130. Upon impact with the surface 130, the sputtered particles of the first material 110 and the second material 120 bond with the surface 130, forming a protective layer of particles from the first material 110 and particles from the second material 120 on the surface 130. That is, the particles from the first material 110 are inter-mixed with particles from the second material 120 to form a protective coating on the surface 130 having combined characteristics of the first material 110 and the second material 120.

In a preferred embodiment, the magnetic field in the magnetron sputtering device causes the particles to sputter in a racetrack or circular pattern on the sputtering target for deposition on the surface 130. Therefore, only a small quantity of particles from the second material 120 are sputtered onto the surface 130 along with a large quantity of particles from the first material 110. Preferably, the first material 110 is a semiconductor or insulating material, and the second material 120 is a conducting material. In a preferred embodiment, the quantity of the first material 110 and the quantity of the second material 120 may be adjusted depending upon the desired thermophysical properties and surface resistivity of the resulting surface coating. That is, the proportion of the surface area of the first material 110 and the second material 120 exposed during sputter deposition equals the amount of the first material 110 and the second material 120 emitted from the sputtering target and the amount deposited at the surface 130. Therefore, the proportionality of the first material 110 and the second material 120 determines the thermophysical and surface resistance properties of the surface coating. By varying the exposed surface area of the first material 110 and the second material 120 along with the magnetic field in the sputtering device chamber, the thermophysical and the surface resistance properties of the coating may be altered.

Preferably, the first material 110 and the second material 120 are blocks, strips, or other solid pieces, for example, of material. Alternatively, the first material 110 and the second material 120 may be in the form of powder. In an alternative embodiment, the first material 110 and the second material 120 may be discs of material. Additionally, the second material 120 may rest inside a cavity of the first material 110 rather than on top of the first material 110 or the order may be reversed. In another embodiment, the first material 110 may rest alongside the second material 120.

Figure 3:
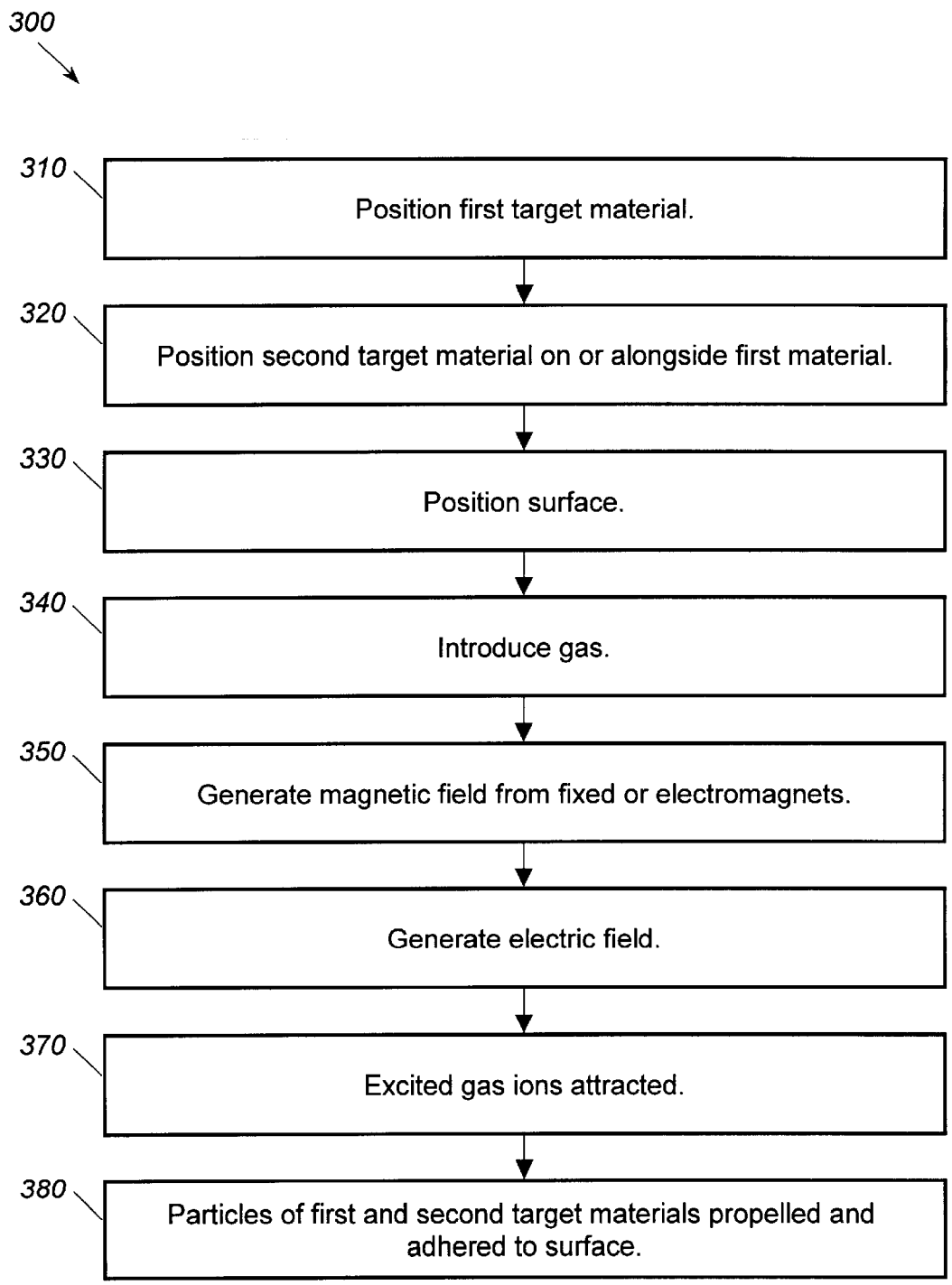
FIG. 3 illustrates a flowchart for coating surfaces with a protective coating having predetermined thermophysical and electrical resistance properties in accordance with a preferred embodiment of the present invention.

FIG. 3 illustrates a flowchart 300 for coating surfaces with a protective coating having predetermined thermophysical properties and electrical resistance. First, at step 310, a first material, such as a semiconductor or insulating material, for example, is positioned in a deposition device, such as a sputtering device, for example. In a preferred embodiment, the semiconductor or insulating material is positioned on the cathode of the sputtering device.

Then, at step 320, a second material, such as a conducting material, for example, is positioned on the first material in the sputtering device. In a preferred embodiment, the second material is magnetized and held in position on the first material by magnets in the cathode of the sputtering device. Alternatively, the second material may be bonded or otherwise affixed to the first material, for example. Alternatively, the second material may be positioned alongside the first material in the sputtering device. The first material and the second material form a sputtering target.

Then, at step 330, a surface to be coated is positioned in the sputtering device. In a preferred embodiment, the surface is a membrane, polymer film, or rigid structure, for example, to be used in a space system. Alternatively, the surface may be for use with a semiconductor device or electrical circuit, for example.

Next, at step 340, an inert gas, such as argon, for example, is introduced into a chamber of the sputtering device. Then, at step 350, a magnetic field is generated in the chamber of the sputtering device. The magnetic field concentrates the gas around the sputtering target. The magnetic field is preferably generated by a fixed magnet or an electromagnet, for example. The magnets generating the magnetic field may be one or more coil magnets, annular magnets, bar magnets, or other magnets, for example. Next, at step 360, an electric field is generated in the chamber of the sputtering device. The introduction of the electric field excites the gas to form a plasma and produces gas ions. Alternatively, the electric field may be generated first, followed by the magnetic field.

Then, at step 370, the excited gas ions are attracted to the cathode of the sputtering device. Thus, the gas ions in the chamber of the sputtering device are deposited on the sputtering target located on the cathode of the sputtering device. The gas ions then strike the first sputtering target material and the second sputtering target material.

Finally, at step 380, particles of the first material and the second material from the sputtering target are impacted by the gas ions and are propelled from the sputtering target to the surface. The particles from the first material and the second material adhere to the surface and form an intermixed protective coating or film on the surface.

By combining two or more standard deposition materials through a co-sputtering process deposited in a proper ratio, a mixed homogenous coating is formed that permits the production of surfaces that have tailored thermophysical properties with less surface resistance. That is, the magnetic field in the sputtering device and the proportion of the exposed surface area of the first material and the exposed surface area of the second material affect the resulting thermophysical properties and surface resistance of the protective coating. Thus, using two or more deposition target materials changes the properties of the resulting sputtered surface coating. The preferred embodiments of the present invention allow the electrostatic discharge properties of a coating to be tailored while maintaining low thermophysical properties (absorptance/emittance ratio). The coating produced has excellent adherence to the surface and stable thermophysical and surface resistance properties. The coating may be a replacement for conductive pigment thermal control paints or second surface mirrors, which are not conducive for flexible membrane application, or which are substantially heavier than the very thin film coating layer.

Traditionally, alloys have proven to be unsuitable as sputtering targets used to produce a coating with desired thermophysical and surface resistance properties due to several complications. For example, the proper proportions of desired materials are difficult to obtain through mixing in an alloy since internal molecular bonding prevents uniform bonding on the coated surface. Additionally, many types of desired materials may be unalloyable or may only form alloys with specific, undesired proportions of materials. Alloys may react during the sputtering process to produce an undesirable coating. Additionally, once an alloy target material is produced, the alloy target material may not be altered to change or modify the desired properties of the coated surface.

The preferred embodiments of the present invention provide an easy solution to the present problem of producing a sputtering target that will yield the desired thermophysical properties and surface resistance in a protective coating. Additionally, the preferred embodiments of the present invention provide a solution to the problem of forming a protective coating that both protects a surface from heat and protects a surface from electrostatic discharge.

The preferred embodiments of the present invention permit the production of thin (preferably t<2000 Angstroms) coatings having tailored, low thermophysical properties (preferably $\alpha/\epsilon$<0.5) for heat control and acceptably low surface resistance properties (preferably $\rho$<$10^6$ Ohms/square) conducive to simple grounding schemes for electrostatic discharge control. The resulting coatings are also flexible, have excellent adherence to surfaces, and are resistant to changes from long term exposure to space radiation plasma environments experienced by spacecraft and other space systems, for example.

While the invention has been described with reference to a preferred embodiment, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method for depositing a coating having desired predetermined thermophysical properties on a surface, said method comprising:

selecting a first deposition material based on the thermophysical properties of said first deposition material;

selecting a second deposition material based on the thermophysical properties of said second deposition material, wherein the thermophysical properties of said second deposition material differ from the thermophysical properties of said first deposition material; and simultaneously depositing at least a portion of said first deposition material and at least a portion of said second deposition material on said surface to form a coating having desired predetermined thermophysical properties.

2. The method of claim 1, further comprising the step of positioning said second material on top of said first material.

3. The method of claim 1, wherein said depositing step comprises sputter depositing at least a portion of said first material and at least a portion of said second material on said surface.

4. The method of claim 1, wherein said first material and said second material are deposited in a predetermined proportion to yield a coating having tailored thermophysical properties and surface resistance properties.

5. The method of claim 1, wherein one of said first material and said second material is an insulating material and the other is a conducting material.

6. A method of depositing a coating having at least one predetermined thermophysical property, said method comprising:

selecting a first deposition material based on the thermophysical properties of said first deposition material;

selecting a second deposition material based on the thermophysical properties of said second deposition material, wherein the thermophysical properties of said second deposition material differ from the thermophysical properties of said first deposition material;

simultaneously depositing said first deposition material and said second deposition material on a surface, wherein said first deposition material and said second deposition material are deposited in a proportion to yield a coating having at least one predetermined thermophysical property.

7. The method of claim 6, wherein said depositing comprises sputter depositing.

8. The method of claim 6, wherein said proportion includes a greater quantity of said first material than said second material.

* * * * *